United States Patent [19]

Holmes, Jr. et al.

[11] 3,991,408
[45] Nov. 9, 1976

[54] SELF-SEQUENCING MEMORY

[75] Inventors: Arthur Wilbert Holmes, Jr., Woodstock; Gerald Bernard Long, Stone Ridge; Richard Charles Paddock; Shing Chou Pi, both of Kingston; Donald Walter Price, Lake Katrine, all of N.Y.

[73] Assignee: International Business Machines Corporation, Armonk, N.Y.

[22] Filed: Nov. 27, 1974

[21] Appl. No.: 527,777

Related U.S. Application Data

[63] Continuation of Ser. No. 334,796, Feb. 22, 1973.

[52] U.S. Cl. .................... 340/172.5; 340/174 VB; 340/173 SP
[51] Int. Cl.² .................. G06F 9/06; G11C 5/06; G11C 17/00
[58] Field of Search ..... 340/172.5, 173 SP, 173 RC, 340/173 MS, 174 A, 174 SP, 174 VB, 173 S; 445/1

[56] References Cited
UNITED STATES PATENTS

| | | | |
|---|---|---|---|
| 3,117,309 | 1/1964 | Wolf | 340/174 VB |
| 3,404,385 | 10/1968 | Ihara | 340/174 |
| 3,435,438 | 3/1969 | Regitz | 340/174 VB |
| 3,473,160 | 10/1969 | Wahlstrom | 340/172.5 |
| 3,618,051 | 11/1971 | Oleksiak | 340/173 R |

*Primary Examiner*—Harvey E. Springborn

[57] ABSTRACT

A self-sequenced read only memory is shown wherein each word line contains dynamic logic circuits for energizing a next word line after the fixed time delay provided by the dynamic logic circuits. Self-sequencing inverters are physically placed within the array area thereby increasing reliability and reducing circuit wiring. When used as a microprogram control storage, the memory is divided into a plurality of self-sequenced control routines. When a certain function is to be performed, the first word line of the control routine for performing the selected function is energized. Since each word line includes a one cycle delay and is wired to the next sequential word line, no separate timing or address control is required to address word lines within a selected control routine. Once a control routine is energized, sequential microinstructions will be automatically fetched including branch and branch-on condition instructions. Branch operations can be implemented by connecting one of the outputs of the array to the branched-to word line. Branch-on condition can be implemented by gating the inverter in the branched-to instruction with an AND circuit. By virtue of the self-sequencing of the memory, branched-to word lines can be sequentially accessing memory words simultaneously with sequential memory word fetch operations within the branched from control routine. The branched-to control routine thereby acts as a modifier routine to modify the bit patterns of the memory words which continue to be fetched by the branched-from control routine.

13 Claims, 5 Drawing Figures

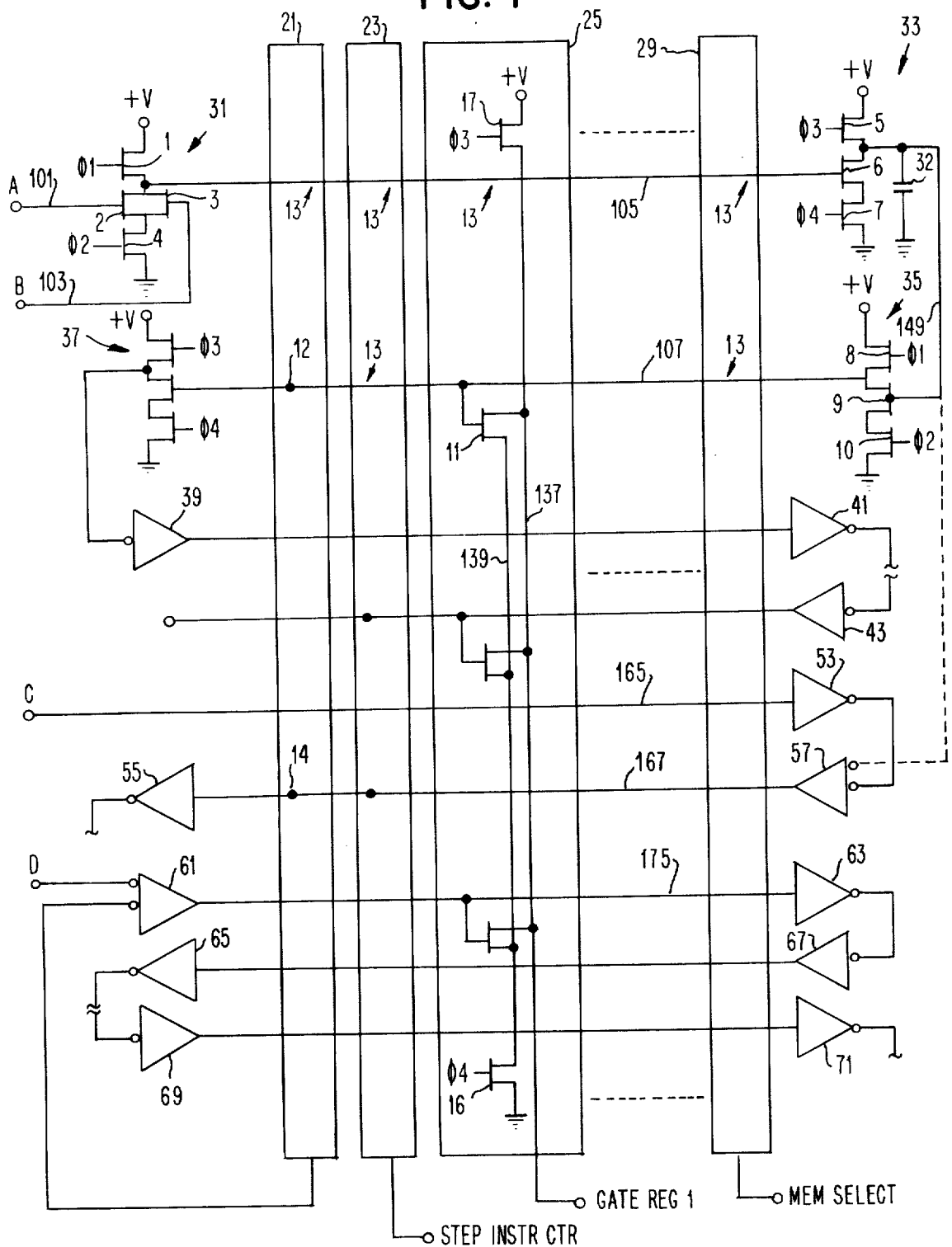

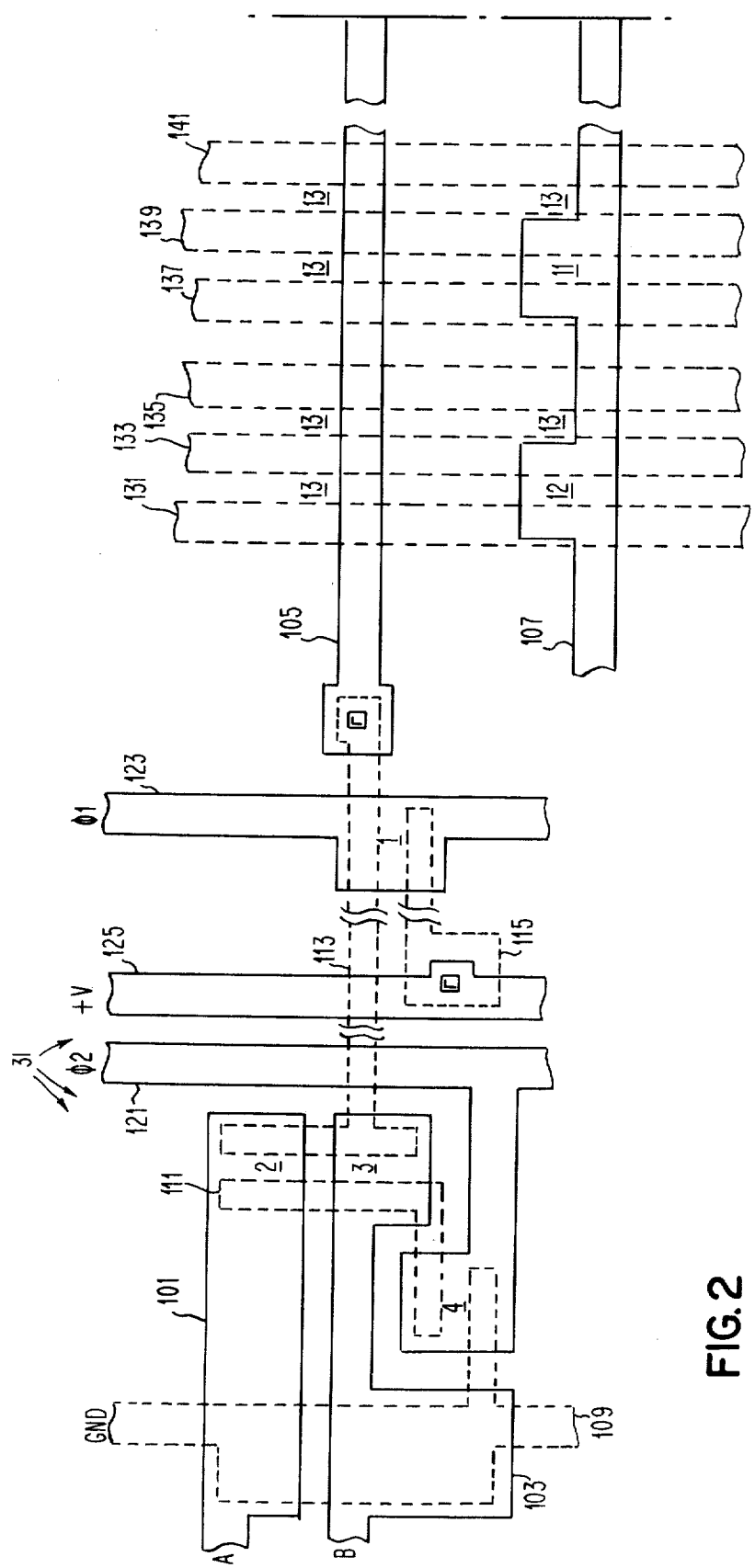

SELF-SEQUENCING MEMORY

This is a continuation of application Ser. No. 334,796 filed Feb. 22, 1973.

BACKGROUND OF THE INVENTION

1. Field of the Invention

The invention relates to electrical communications systems with storage of signals in general and more specifically to integrated circuit read only memories.

2. Description of Prior Art

Some of the conventially known memory word line addressing methods include incrementing a binary address counter each time a next word line is to be energized. The binary outputs from the counter are decoded in order to energize each individual word line. Another technique which has been employed is to provide a ring counter having a different stage connected to each word line.

One of the substantial disadvantages of separate addressing counter means for addressing an integrated circuit is that substantial substrate surface area is required just to make the wiring connections between the counter and the memory array. An additional disadvantage is that each wiring connection is subject to a statistical probability of causing a circuit failure; therefore the substantial number of wiring connections required to connect an address counter to a memory array substantially reduces the integrated circuit production yield and reliability.

Further disadvantages which arise when utilizing address counters to address a memory array are the complex and special counter circuit connections which are required to perform a branch and to perform a branch-on condition function.

SUMMARY OF THE INVENTION

It is an object of this invention to energize word lines of a read only memory without the need for separate addressing circuits.

It is a further object of this invention to substantially reduce the number of wiring connections which are required in an integrated circuit read only memory.

It is still a further object of this invention to substantially reduce the complexity of branch and branch-on condition addressing circuits for use with a read only memory.

It is an even further object of this invention to provide word line energizing circuits internal to an integrated circuit read only memory.

It is an even still further object of this invention to provide word line energizing logic gate and memory column logic gate in a single integrated circuit array to reduce the electrical connection area and increase reliability.

The foregoing and other objects, features and advantages of the invention, which will become apparent from the following more particular description of a preferred embodiment of the invention as illustrated in the accompanying drawings, are accomplished by using dynamic logic word line gates, each having a substantial and predictable time delay.

Each word line, except the last word line of a sequence, is connected to a next word line to be energized by dynamic logic circuitry providing a time delay equal to one memory cycle. For sequential addressing, the output from a word line is connected via dynamic logic circuitry to the next sequential work line. For addressing a branched to word line, the branched from word line is connected via dynamic logic circuitry to the branched to word line. A conditional branch occurs when the dynamic logic circuitry includes an AND logic gate having an inhibit input. When the read only memory column logic gates are also dynamic logic gates, a branch addressing function from any one of a plurality of word lines to a common branched to word line can be accomplished by connecting a bit position output from an array of logic gates to the branched to word line. The column logic gate thus becomes part of the dynamic logic circuitry providing the branch addressing connection. A logical connection is provided at each branched from word line to an input of the column logic gate to provide a branch to the common branched to word line. The branched from word line may simultaneously address a next sequential or another branched to word line by means of additional dynamic logic circuitry as previously described.

BRIEF DESCRIPTION OF THE DRAWINGS:

FIG. 1 shows a schematic circuit diagram of a field effect transistor embodiment of the invention.

FIG. 2, comprising FIGS. 2a and 2b, shows an example of an integrated circuit layout of the upper two word lines of FIG. 1 and their associated dynamic logic circuits.

A PREFERRED EMBODIMENT OF THE INVENTION

Figure 2B:
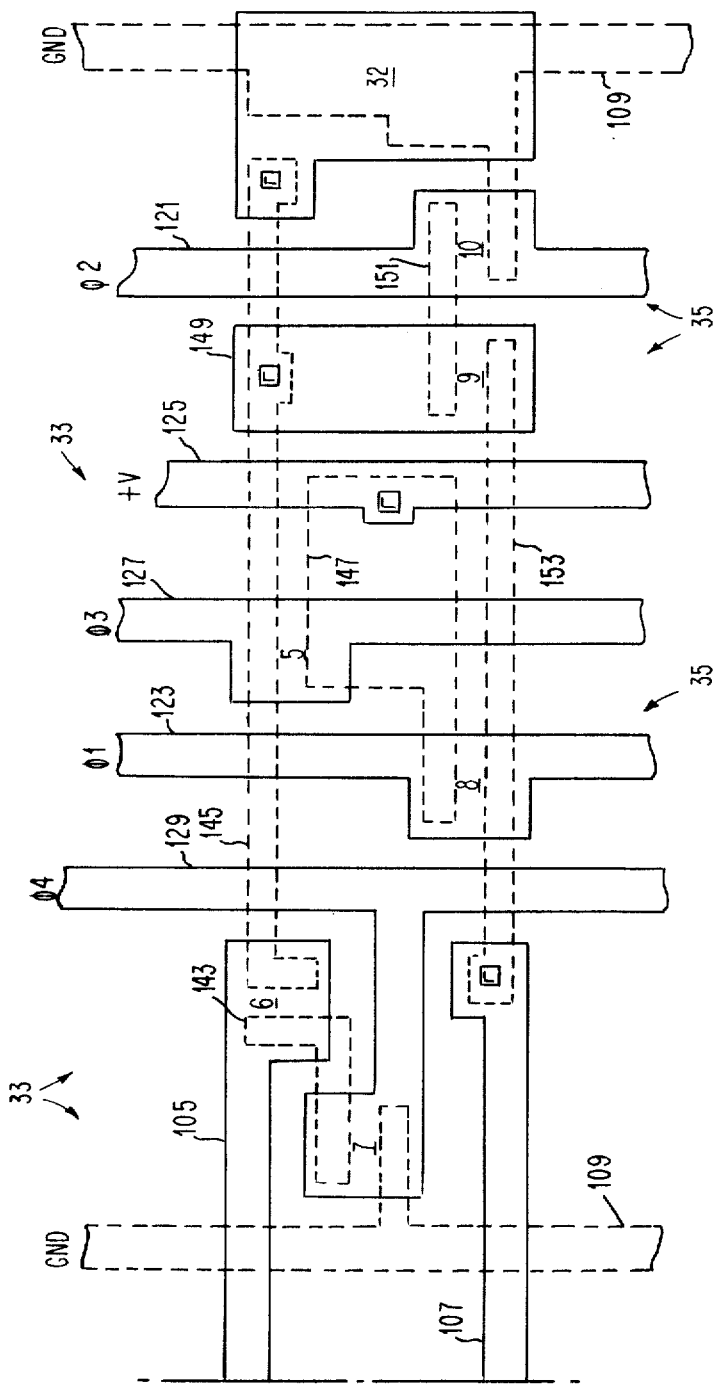
Figure 3:
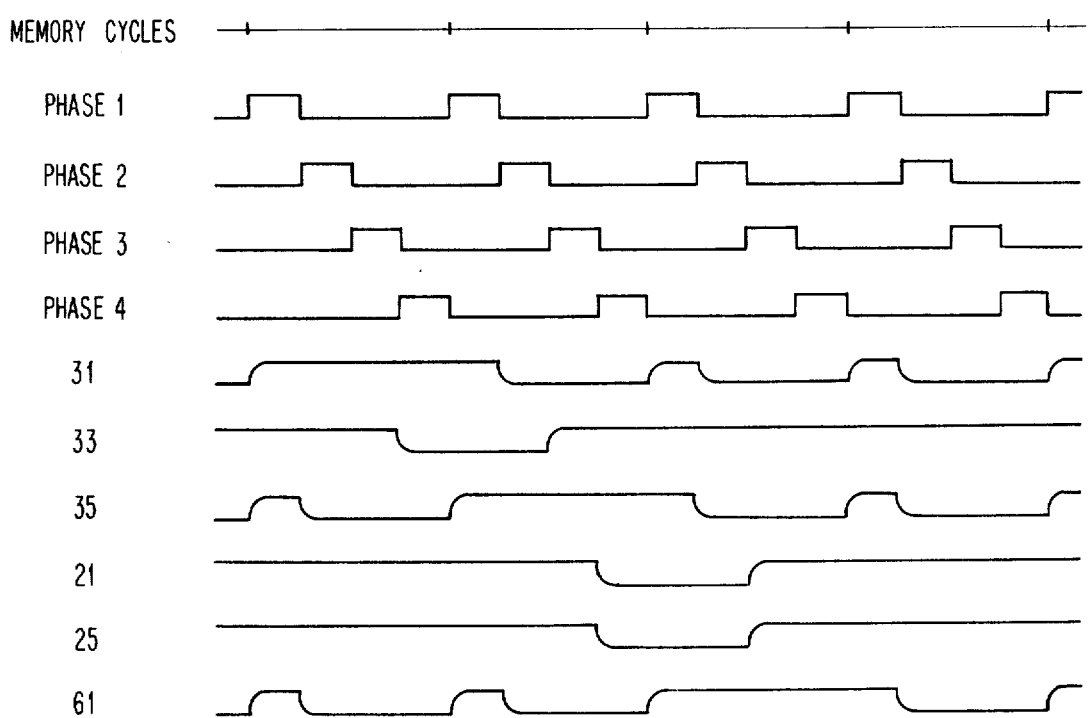
FIG. 3 shows a simple timing diagram of the field effect transistor embodiment of the invention.

Referring now to FIG. 1, an array of logic gates including column logic gates 21, 23, 25, and 29 is shown. Each column logic gate has a bit position output appearing at the bottom of the Figure. In the example of the preferred embodiment being described, a read only storage is used as a microprogram control storage and therefore each bit position output is identified with a specific control function such as step instruction counter, gate register 1, memory select, and so forth. It will be recognized by those skilled in the art of memory design that the bit position output can be used for any function including definitions of the bit value in an output word when the read only memory is being used as a general purpose memory and not as a microprogram control storage. Each column logic gate therefore defines a bit position column in the read only memory array.

The read only memory of FIG. 1 also has a plurality of word lines. Each word line has a conductor such as conductor 105. Each word line has a plurality of field effect transistors which form logical connections such as 11, 12, 14, and a plurality of logical nonconnections 13, to inputs of column logic gates 21 through 29. Logical connections are provided by fabricating a thin oxide layer and a logical OR field effect transistor gate metallization over conditional memory deactivation circuit source and drain diffusions such as diffusions 139 and 137. Logical nonconnections are provided by fabricating a thick oxide layer over the source and drain diffusions. U.S. Pat. No. 3,611,437 is referred to as an example of further detailed teachings as to how the logical connections and logical nonconnections referred to above may be fabricated.

Each word line after the first word line of a control sequence comprising a plurality of word lines has dynamic logic addressing circuitry connecting it to a previously energized word line. Input gate 57 and output gate 53 are examples of such connecting dynamic logic circuitry. For purposes of example, output gate 53 and input gate 57 are used in series to provide the dynamic logic addressing connection circuitry, gate 53 and 57 together providing a one memory cycle time delay. It will be recognized by those skilled in the art that output gate 53 can be removed and a direct addressing connection made from word line conductor 165 to the input of input gate 57 so long as the time delay provided by input gate 57 is long enough for one memory cycle. Alternatively, of course, input gate 57 can be removed whereby the time delay provided by output gate 53 would be relied upon to provide the time delay between the time the word line of conductor 165 was energized and the time when conductor 167 of the next sequential word line was energized. If a single gate is used to connect a word line to a next word line as described above, the single gate must of course be a non-inverting gate.

As can be seen by reference to FIG. 1, a branch from the word line having conductor 105 to the word line of conductor 167 can be accomplished by extending wire 149 as shown by the dashed line of FIG. 1 to connect the output of output gate 33 as a negative logical OR input of input gate 57 but with present configuration this extending of wire 49 becomes unnecessary.

Referring again to FIG. 1, column logic circuit 21 is connected so as to provide a branch addressing connection from the word line of conductor 107, controlled by a branch condition on the word line of conductor 167, to the word line of conductor 175. The above mentioned branching operations are accomplished by providing positive logical OR input connections 12 and 14 to inverting column logic circuit 21. The output of column logic circuit 21 is connected to a negative AND input to inverting input gate 61. Therefore, whenever conductors 107 or 167 are energized by a positive voltage signal from their dynamic logic input circuit during phase 4, a negative signal appears at the output of column logic gate 21 during the following phase 2, which is connected to one input of negative AND gate 61. If the second input to gate 61, labeled "D", is also at a negative level, conductor 175 will be energized. In this manner a conditional branch can be accomplished.

Referring now to FIGS. 2a and 2b, outlines of diffusion and metallization areas of an integrated field effect transistor dynamic logic circuit embodiment of part of FIG. 1 will be described. The outlines of diffusion layer areas are broken, whereas the outlines of metallization layer areas are solid.

Input gate 31 is a dynamic logic gate having a finite predictable time delay. The time delay is achieved by unconditionally activating a memory means and conditionally deactivating the memory means a predetermined period of time later. In the field effect transistor circuits of FIGS. 2a and 2b, the memory means is in the form of node capacitance. Node capacitance includes wiring capacitance, as well as gate-to-source and gate-to-drain capacitances of field effect transistors being driven by the node. For example, nodal capacitance at the output of gate 31 is provided by diffusion area 113, metallization area 105, and the gate capacitance of transistor 6. The memory of gate 31 in the form of output node capacitance is unconditionally charged at phase 1 memory clock time by a field effect transistor circuit comprising diffusion areas 113 and 115 and metallization area 123. Diffusion areas 113 and 115 form the source and drain diffusions, respectively, while metallization area 123 forms the gate metallization of transistor 1. A thin oxide layer separates metallization 123 from diffusions 113 and 115 in the area of transistor 1. Diffusion area 115, forming the drain diffusion of transistor 1, is connected by a through hole to voltage metallization area 125, which is connected to a positive voltage source. Metallization area 123 is connected to the phase 1 output of a four-phase memory cycle clock which is not shown. the memory cycle clock can be any one of a number of well-known clock circuits as often used in computers for dividing a memory cycle into four separate time intervals called phases. The memory of gate 31 is conditionally deactivated by conditionally discharged the output node capacitance of gate 31 by a second field effect transistor circuit comprising field effect transistors 2, 3 and 4. The conditions to which the conditional memory deactivation circuit is responsive appear as signals at inputs A and B to metallization areas 101 and 103, respectively. A portion of metallization areas 101 and 103 form the gate metallizations of transistors 2 and 3. Diffusion 113 extends under metallization areas 101 and 103 to form the drain diffusions of transistors 2 and 3. In a like manner, diffusion 111 extends under metallization areas 101 and 103 to form the source diffusions of transistors 2 and 3. As in the case of transistor 1, the gate metallizations of transistors 2 and 3, and, for that matter, of all transistors of the instant embodiment, are separated from their source and drain diffusions by a layer of thin oxide. Transistor 1 of circuit 31 charges the capacitance of the node including metallization 105 to +V during phase 1. If both A and B inputs to circuit 31 are substantially zero volts during phase 2 no series path through transistor 4 is provided because both transistors 2 and 3 remain non-conducting and the node capacitance remains charged to +V. Therefore during the following phase 3 and phase 4, the voltage on metallization 105 remains at substantially +V. A positive voltage on metallization 101 or on metallization 103 will cause transistors 2 or 3 to become conductive, respectively, thereby conditioning the second field effect transistor to discharge the output node capacitance of gate 31. Although conditioned for discharge of the output node capacitance, transistors 2 and 3 do not conduct current until series transistor 4 becomes conductive. The series connection of transistor 4 to transistors 2 and 3 is accomplished by forming the drain diffusion of transistor 4 as an extension of diffusion area 111. The source diffusion of transistor 4 is an extension of diffusion area 109 which is connected to a reference voltage potential such as ground. The gate metallization of transistor 4 is an extension of metallization area 121 which is connected to the phase 2 output of the aforementioned memory timing clock. In this manner, transistor 4 is rendered conductive only at phase 2 time, thereby conditinally discharging the output node of gate 31 as determined by the signals at inputs A and B only at phase 2 time. Thus, if both A and B have negative signals, transistors 2 and 3 are rendered nonconducting and the output node of gate 31 remains at a positive level. If the input signal at A or B is at positive level, the capacitive charge stored at the output node of gate 31 will be discharged. Although gate 31 and all of its sister gates in the array of logic gates being described are enhancement mode field effect transistor logic gates driven from a positive voltage source, it will be recognized by those skilled in the art of logic gate design that equivalent switching devices responsive to negative input signals and connected to negative voltage sources could be used to obtain the advantages of the instant invention without departing from the spirit and scope thereof. Examples of alternate circuits appear in U.S. Pat. Nos. 3,601,627 and 3,638,036. Furthermore, although padding capacitors are shown at inputs A and B, embodied in the form of substantial areas of metallizations 101 and 103, over ground diffusion 109, the existence or need for such padding capacitors is determined by circuit design considerations such as the total node capacitance of the nodes to which metallization areas 101 and 103 are connected. Therefore the aforementioned padding capacitors do not form a necessary part of the instant invention. In addition to having an input gate, such as gate 31, each word line has a conductor such as metallization area 105. The conductor of each word line forms the gate metallization of a field effect transistor wherever a logical connection between the word lines and a column logic gate is desired. A thick oxide layer separates the conductor metallization area from source and drain diffusions of column logic circuits to prevent field effect conductivity wherever a logical nonconnection is to be implemented between a word line and a column logic gate. Inasmuch as column logic circuits 21, 23, 25, and 29 as shown is FIG. 1, are all logically not connected to the word line of conductor 105, a thick oxide layer exists between metallization area 105 and the source, channel, and drain areas where input field effect transistors would be fabricated if logical connections were desired. Several example logical nonconnections signified by the absence of input transistors are labeled 13 in FIGS. 1 and 2a.

Referring now to FIG. 2b, the diffusion and metallization area of an output gate for the word line of conductor 105 and an input gate for the word line of conductor 107 are shown. Again, the outlines of diffusion layer areas are broken, whereas the outlines of metallization areas are shown as solid lines. Being one of the array of logic gates forming the read only memory, output gate 33 also has an unconditional memory activation circuit in the form of transistor 5, a memory means in the form of the output node capacitance of gate 33 and a conditional memory deactivation circuit in the form of field effect transistors 6 and 7. Unconditional precharge transistor 5 is located under a portion of metallization area 127 which is connected to the phase 3 output of the memory clock previously described. A portion of diffusion 145 forms the source diffusion of transistor 5 and a protion of diffusion 147 forms the drain diffusion of transistor 5. Diffusion 147 is connected via a through hole to metallization area 125, which is, in turn, connected to a positive voltage source. Diffusion 145 is also the drain diffusion of transistor 6 which conditionally discharges the output capacitance of gate 33 at a time determined by transistor 7. Diffusion 145 is also connected to metallization conductor 149 for providing a wiretap from the output of gate 33 to input of gate 35. Diffusion area 143 forms the source diffusion of transistor 6 and the drain diffusion of transistor 7. The gate of transistor 6 is formed as an extension of the metallization area 105 which is energized by the output signal from input gate 31. The source of transistor 7 is an extension of diffusion area 109 which is connected to a reference voltage potential as previously described with respect to gate 31. The gate of transistor 7 is formed as an extension of metallization 129 which is connected to the phase 4 output of the previously described memory timing clock. A padding capacitor 32 is connected to the output of gate 33 for the reasons described with respect to the padding capacitors at inputs A and B of gate 31. Capacitor 32 is formed by a metallization area lying above a portion of ground diffusion area 109 and separated therefrom by a layer of thin oxide. The metallization area of caapacitor 32 is connected to diffusion 145 by a through hole.

In a manner similar to the description with respect to gate 31, transistors 8, 9 and 10 form the input gate connected to word line conductor 107. Diffusion 153 and diffusion 147 form the source and drain of unconditional precharge transistor 8, respectively. The gate of transistor 8 is an extension of metallization area 123 which is connected to the phase 1 output of the memory timing clock previously described. Diffusion 153 also forms the drain diffusion of transistor 9 and is connected to metallization area 107 forming the conductor of the next sequential word line. Diffusion 151 is the source of transistor 9, as well as the drain of transistor 10. The gate of transistor 9 is formed by extending metallization area 149 over the source and drain of transistor 9 and separating it therefrom by a layer of thin oxide. The source of transistor 10 is an extension of ground diffusion area 109 as shown in FIG. 2b. The gate metallization of transistor 10 is part of metallization area 121 which is connected to the phase 2 output of the memory timing clock.

OPERATION OF THE PREFERRED EMBODIMENT

With the description of dynamic logic gates 31, 33, and 35 in mind, their operation will now be reviewed in order to show that a one memory cycle time delay is provided by the logic circuits of each word line before the next word line is energized. At phase 1 time, conductor 105 is unconditionally charged. At phase 2 time, conductor 105 is conditionally discharged under control of the signals at inputs A and B. At phase 4 time of the same memory cycle, capacitor 32 associated with the output node of gate 33 is conditionally discharged under control of the voltage on conductor 105. In the event that conductor 105 remained charged at phase 2 time because a negative signal appeared at both inputs A and B at phase 2 time, capacitor 32 will be discharged at phase 4 time. At phase 2 time of the next memory cycle, conductor 107 will not be discharged since transistor 9 will be conducting. Therefore, it can be seen that during phase 3 and 4 times of the first described memory cycle, conductor 105 will be energized to activate logical connections of the first word line. During phase 3 and 4 times of the next memory cycle, conductor 107 will be validly energized, thereby reading out logical connections to the next sequential word line.

As previously described, the contents of each word line of the memory of the preferred embodiment is defined by logical connections and logical nonconnections. Referring again to FIG. 2a, the logical connections 11 and 12 to column logic gates 25 and 21, respectively, will be described. Input transistors to the column array logic gates are formed by a plurality of vertical diffusion lines 131 through 141 having areas therebetween which are capable of forming field effect transistor channels. For example, a logical connection of conductor 107 to column logic gate 25 is formed by field effect transistor 11 having a source which is part of diffusion 139 and a drain which is part of diffusion 137. The gate of transistor 11 is formed as an extension of the metallization of conductor 107 which has a thin oxide layer between it and the source, drain, and channel areas of transistor 11. It will be recognized by those skilled in the art of integrated field effect transistor layouts that the metallization of conductor 107 could have been formed as a continuously wide band having thick oxide beneath it in all areas except where a transistor is to be formed. For purposes of more clearly illustrating the location of input transistors to the array logic circuits, the metallization of conductors 105 and 107 is shown herein as being wider whenever a transistor is to be formed. In a like manner, transistor 12 of column logic circuit 21 is formed over drain diffusion 131 and source diffusion 133. It should be noted that diffusion 133 acts as the source diffusion for both column logic circuits 21 and 23. In this manner, three diffusions can provide drains and sources for input transistors to two column logic gates. Like the input and output gates of each word line, the logic circuits of each column logic gate comprise an unconditional capacitance charging transistor such as transistor 17 which is activated at each phase 3 time, a capacitive memory and a conditional discharge circuit comprising the transistors of logical word line connections and a series transistor such as transistor 16 which is rendered conductive during phase 4 time. As described with respect to FIG. 2a, the source diffusion 139 and its series transistor 16 shown in FIG. 1 of column logic gate 25 is shared with its next right most column logic gate. In this regard, it should be noted that unconditional precharge transistors, such as transistor 17, are connected to drain diffusions which form the output nodes of each column logic gate and therefore a separate unconditional precharge transistor and drain diffusion must be provided for each column logic gate.

While the invention has been particularly shown and described with reference to a preferred embodiment thereof, it will be understood by those skilled in the art that various changes in form and detail, in addition to those already suggested, may be made therein without departing from the spirit and scope of the invention. For example, although the integrated circuit of the preferred embodiment employs only a single metallization layer and a single diffusion layer, each being divided into metallization areas and diffusion areas, separated by thick and thin oxide layers, to form logical nonconnection and logical connections, it is well recognized that pluralities of metallization and/or diffusion layers can also be employed to obtain the advantages of the instant invention. Furthermore, although the memory means of the input and output gates of the embodiment are in the form of node capacitance of field effect transistor circuits, it is recognized that equivalence of field effect transistor circuits and their nodal capacitances can be fabricated in order to obtain the finite and predictable time delays necessary for proper operation of the instant invention, and therefore it is clear that the instant invention is not limited to the aforementioned field effect transistor embodiment thereof.

What is claimed is:

1. A read only memory comprising:
    a plurality of dynamic logic gates, each of said dynamic logic gates having at least a first input and a second input, an output of each of said dynamic logic gates being a bit position output of said memory;
    a first word line having first connections to selected ones of said first inputs, said first connections defining a first word of stored binary bits;
    means for generating a first signal on said first word line to cause said plurality of dynamic logic gates to provide said first word of binary bits;
    a second word line having a dynamic logic input circuit, an input of said dynamic logic input circuit operatively connected to said first word line and responsive to said first signal on said first word line to generate a second signal on said second word line a predetermined period of time after the occurrence of said first signal, said second word line having second connections to selected ones of said second inputs, said second connections defining a second word of stored binary bits.

2. The memory of claim 1 further comprising:
    a dynamic logic output circuit having an input connection to said first word line and an output connected to said input of said dynamic logic input circuit for operatively connecting said first word line to said input of said dynamic logic input circuit.

3. The read only memory of claim 2 wherein said dynamic logic output circuit further comprises:
    a first memory device connected to said output of said dynamic logic output circuit;
    a first unconditional memory device activation circuit connected to said first memory device;
    a first conditional memory device deactivation circuit connected to said first memory device and to said first word line for deactivating said first memory device a predetermined period of time after said first memory device has been activated whenever said first signal has been generated on said first word line; and
wherein said dynamic logic input circuit further comprises:
    a second memory device which is a part of said second word line;
    a second unconditional memory device activation circuit connected to said second memory device;
    a second conditional memory device deactivation circuit connected to said second memory device and to said input of said dynamic logic input circuit for deactivating said second memory device a predetermined period of time after said second memory device has been activated whenever said first signal has not been generated on said first word line.

4. The read only memory of claim 2 wherein said plurality of dynamic logic gates comprise logical OR circuits;
    wherein said dynamic logic input circuit comprises a logical AND circuit having at least one input.

5. The read only memory of claim 2 wherein said first and second word line of said read only memory is on an integrated circuit substrate and wherein each of first and second word lines has a dynamic logic input circuit at one end of said word line and a dynamic logic output circuit at another end of said word line.

6. The read only memory of claim 2, wherein said dynamic logic output circuit further comprises:
    a first capacitive memory means connected to said output of said dynamic logic output circuit;

a first field effect transistor circuit connected between a voltage source and said first capacitive memory means for charging said first capacitive memory means to substantially the voltage level of said voltage source;

a second field effect transistor circuit connected between said first capacitive memory means and a reference voltage source and controlled by said signal on said first word line to conditionally discharge said first capacitive memory means to substantially the voltage of said reference voltage source after said first capacitive memory means has been charged; and wherein said dynamic logic input circuit further comprises:

a second capacitive memory means of said second word line;

a third field effect transistor circuit connected between said voltage source and said second capacitive memory means for charging said second capacitive memory means to substantially the voltage level of said voltage source;

a fourth field effect transistor circuit connected between said second capacitive memory means and said reference voltage source and controlled by the discharged condition of said first capacitive memory means to prevent the discharge of said second capacitive memory means to substantially the voltage of said reference voltage source after said second capacitive memory means has been charged thereby providing said second signal on said second word line a predetermined period of time after the occurrence of said first signal.

7. The memory of claim 1 further comprising:

a connection between an output of one of said plurality of dynamic logic gates and said input of said dynamic logic input circuit, said one of said plurality of dynamic logic gates having one of said first connections to said first word line for operatively connecting said first word line to said input of said dynamic logic input circuit.

8. The read only memory of claim 7 wherein said plurality of dynamic logic gates comprise logical OR circuits;

wherein said dynamic logic input circuit comprises a logical AND circuit having at least one input.

9. The read only memory of claim 7 wherein each of said plurality of dynamic logic gates comprises:

a first memory device connected to said output of said dynamic logic gate;

a first unconditional memory device activation circuit connected to said first memory device;

a first conditional memory device deactivation circuit connected to said first memory device and having a connection to said first input and a connection to said second input for conditionally deactivating said first memory device a predetermined time after said first memory device has been activated thereby providing an output signal at said output of said dynamic logic gate; and wherein said dynamic logic input circuit further comprises:

a second memory device connected to said second inputs of said dynamic logic gates;

a second unconditional memory device activation circuit connected to said second memory device;

a second conditional memory device deactivation circuit connected to said second memory device and to said input of said dynamic logic input circuit for deactivating said second memory device a predetermined period of time after said second memory device has been activated whenever said first signal has not been generated on said first word line.

10. The read only memory of claim 7, wherein said one of said plurality of dynamic logic gates further comprises:

a first capacitive memory means connected to said output of said one of said plurality of dynamic logic gates;

a first field effect transistor circuit connected between a voltage source and said first capacitive memory means for charging said first capacitive memory means to substantially the voltage level of said voltage source;

a second field effect transistor circuit connected between said first capacitive memory means and a reference voltage source and controlled by said signal on said first word line to conditionally discharge said first capacitive memory means to substantially the voltage of said reference voltage source after said first capacitive memory means has been charged; and wherein said dynamic logic input circuit further comprises:

a second capacitive memory means of said second word line;

a third field effect transistor circuit connected between said voltage source and said second capacitive memory means for charging said second capacitive memory means to substantially the voltage level of said voltage source;

a fourth field effect transistor circuit connected between said second capacitive memory means and said reference voltage source and controlled by the discharged condition of said first capacitive memory means to prevent the discharge of said second capacitive memory means to substantially the voltage of said reference voltage source after said second capacitive memory means has been charged thereby providing said second signal on said second word line a predetermined period of time after the occurrence of said first signal.

11. The memory of claim 1 wherein each of said dynamic logic gates further comprises a third input, and wherein said memory further comprises:

a third word line having a second dynamic logic input circuit, an output of said second dynamic logic input circuit operatively connected to said first word line and responsive to said first signal on said first word line to generate a third signal on said third word line said predetermined period of time after the concurrence of said first signal, said third word line having third connections to selected ones of said third inputs, said third connections defining a third word of stored binary bits, whereby both said second word of binary bits and said third word of binary bits simultaneously appear at said outputs of said dynamic logic gates said predetermined period of time after the occurrence of said first signal.

12. The memory of claim 11 further comprising:

a dynamic logic output circuit having an input connected to said first word line and an output connected to said input of said dynamic logic input circuit for operatively connecting said first word line to said input of said dynamic logic circuit; and a connection between an output of one of said dynamic logic gates and said input of said second dynamic logic input circuit, said one of said plurality of dynamic logic gates having one of said first connections to said first word line for operatively connecting said first word line to said input of said second dynamic logic circuit.

13. A read only storage comprising:

a plurality of word lines including a first word line having an input and an output and a second word line having an input and an output;

a plurality of dynamic logic gates, each corresponding to a bit position of word stored in said read only memory;

means selectively connecting said first word line to said plurality of dynamic logic gates in accordance with the bit pattern of a first word stored in said read only storage;

means selectively connecting said second word line to said plurality of dynamic logic gates in accordance with the bit pattern of a second word stored in said read only storage;

a first input signal;

means applying said input signal to said input of said first word line to energize said means for selectively connecting said first word line to said plurality of dynamic logic gates causing signals to be produced by said plurality of dynamic logic gates representing said first word stored in said read only storage; and dynamic logic means connecting said output of said first word line to said input of said second word line, said dynamic logic means being responsive to said first input signal to apply a second input signal to said second word line a predetermined period of time after the occurrence of said first input signal to energize said plurality of dynamic logic gates causing second signals to be produced by said dynamic gates representing said second word stored in said read only memory.

* * * * *